United States Patent
Wang (10) Patent No.: US 10,326,465 B1
(45) Date of Patent: Jun. 18, 2019

(54) ANALOG TO DIGITAL CONVERTER DEVICE AND METHOD FOR GENERATING TESTING SIGNAL

(71) Applicants: GLOBAL UNICHIP CORPORATION, Hsinchu (TW); TAIWAN SEMICONDUCTOR MANUFACTURING CO., LTD., Hsinchu (TW)

(72) Inventor: Ting-Hao Wang, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/109,776

(22) Filed: Aug. 23, 2018

(30) Foreign Application Priority Data

May 18, 2018 (CN) .......................... 2018 1 0477103

(51) Int. Cl.
  *H03M 1/10* (2006.01)
(52) U.S. Cl.
  CPC ................................ *H03M 1/1071* (2013.01)
(58) Field of Classification Search
  USPC ................................................. 341/120, 155
  See application file for complete search history.

(56) References Cited

U.S. PATENT DOCUMENTS

| | | | | |
|---|---|---|---|---|
| 7,835,478 B2* | 11/2010 | Ashish | ................ | H03M 1/121 341/155 |
| 8,730,072 B2 | 5/2014 | Petigny et al. | | |
| 8,933,833 B2* | 1/2015 | Yasuda | ................ | H03M 3/466 341/100 |
| 9,258,004 B2* | 2/2016 | Kappes | ................ | H03M 1/005 |
| 2002/0145546 A1* | 10/2002 | May | ................ | H03H 17/0621 341/61 |
| 2007/0098065 A1* | 5/2007 | Ashish | ................ | H03M 1/121 375/240.03 |
| 2008/0136692 A1* | 6/2008 | Lerdworatawee | ...... | G11C 11/22 341/143 |
| 2010/0079324 A1* | 4/2010 | Lakdawala | ........... | H03M 3/344 341/143 |

FOREIGN PATENT DOCUMENTS

TW        201803276 A       1/2018

\* cited by examiner

*Primary Examiner* — Jean B Jeanglaude
(74) *Attorney, Agent, or Firm* — CKC & Partners Co., LLC (57) ABSTRACT

An analog-to-digital converter (ADC) device includes analog-to-digital converter circuitries and a data output circuitry. The ADC circuitries correspond to channels respectively, and convert an input signal to generate quantization outputs according to interleaved clock signals, wherein each of the interleaved clock signals has a sampling frequency. The data output circuitry performs a down-sampling operation according to a first control signal and the quantization outputs, in order to generate a digital signal. The first digital signal is for determining a performance of the ADC circuitries, and a frequency of the digital signal is N/M times of the sampling frequency, and N is a positive integer and is a number of the channels.

16 Claims, 5 Drawing Sheets

| ADC device 100 having multiple channels generates quantization outputs Q1-QN according to input signal VIN and interleaved signals CLK1-CLKN, in which each clock signals CLK1-CLKN has the sampling frequency fs | ∽ S501 |

↓

| Data output circuitry 130 performs the down-sampling operation, in order to generate the digital signal D0 for testing, in which the frequency of the digital signal D0 is equivalent (N/M)×fs | ∽ S502 |

FIG. 5

ANALOG TO DIGITAL CONVERTER DEVICE AND METHOD FOR GENERATING TESTING SIGNAL

RELATED APPLICATIONS

This application claims priority to China Application Serial Number 201810477103.5, filed May 18, 2018, which is herein incorporated by reference in its entirety.

BACKGROUND

Technical Field

The present disclosure relates to an analog-to-digital converter device. More particularly, the present disclosure relates to a time-interleaved analog-to-digital converter and a method for generating a testing signal thereof.

Description of Related Art

An analog-to-digital converter (ADC) has been widely applied to various electronic devices, in order to covert an analog signal to a digital signal for subsequent signal processing. With the increasing in the resolution and operating speed of the ADC, the cost and the difficulty on measuring the performance the ADC are increased. For example, when the resolution becomes higher, the pins of the ADC required to be tested are more, which results in a larger circuit area. Alternatively, when the operating speed becomes higher, the data rate of the converted digital signal are higher, which results in a higher requirement of a measurement instrument.

SUMMARY

Some aspects of the present disclosure are to provide an analog-to-digital converter device that includes a plurality of analog-to-digital converter circuitries and a data output circuitry. The plurality of analog-to-digital converter circuitries correspond to a plurality of channels respectively and are configured to convert an input signal to generate a plurality of quantization outputs according to a plurality of interleaved clock signals, in which each of the plurality of interleaved clock signals has a sampling frequency. The data output circuitry is coupled to the plurality of analog-to-digital converter circuitries and is configured to perform a down-sampling operation according to a first control signal and the plurality of quantization outputs, in order to generate a first digital signal. The first digital signal is for determining a performance of the plurality of analog-to-digital converter circuitries, and a frequency of the first digital signal is (N/M) times of the sampling frequency, and N is a positive integer and is a number of the plurality of channels.

Some aspects of the present disclosure are to provide a method for generating testing signal that includes the following operations: converting, by a plurality of analog-to-digital converter circuitries that correspond to a plurality of channels respectively, an input signal according to a plurality of interleaved clock signals to generate a plurality of quantization outputs, in which each of the plurality of interleaved clock signals has a sampling frequency; and performing a down-sampling operation according to a first control signal and the plurality of quantization outputs, in order to output a first digital signal, in which the first digital signal is for determining a performance of the plurality of analog-to-digital converter circuitries, a frequency of the first digital signal is N/M times of the sampling frequency, and N is a positive integer and is a number of the plurality of channels.

As described above, the ADC device and the method for generating the testing signal may perform the down-sampling operation on outputs of ADCs in multiple channels, in order to generate a testing signal having lower frequency. As a result, the hardware cost and the difficulty for measuring the overall performance of the ADC device can be reduced.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present embodiments. Furthermore, for simplifying the drawings, some of the conventional structures and elements are shown with schematic illustrations.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

In this document, the term "circuitry" may indicate a system formed with one or more circuits. The term "circuit" may indicate an object, which is formed with one or more transistors and/or one or more active/passive elements based on a specific arrangement, for processing signals.

As used herein, "about", "substantially" or "equivalent" shall generally mean within 20 percent, preferably within 10 percent, and more preferably within 5 percent of a given value or range. Numerical quantities given herein are approximate, meaning that the term "about", "substantially" or "equivalent" can be inferred if not expressly stated.

Figure 1A:
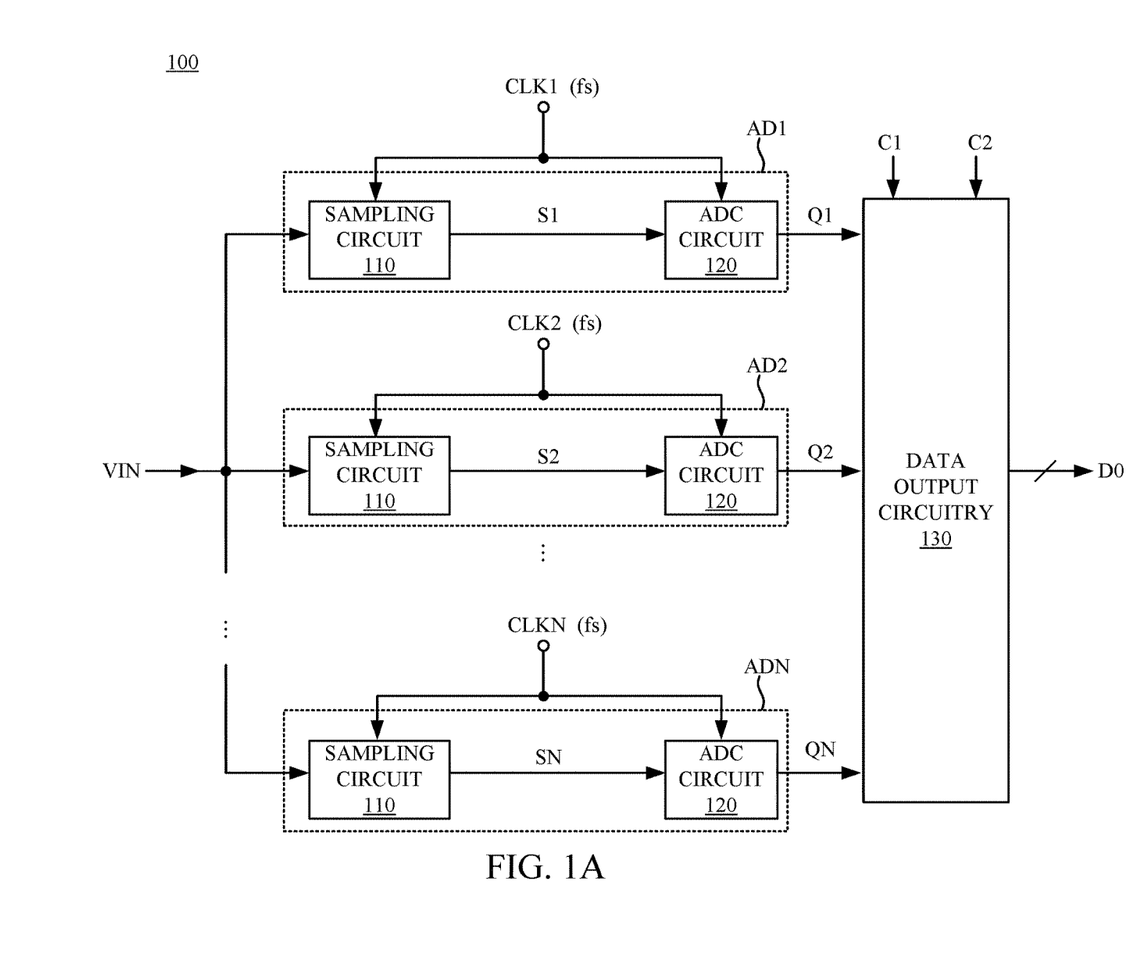
FIG. 1A is a schematic diagram of an analog-to-digital converter (ADC) device, according to some embodiments of the present disclosure.
Figure 1B:
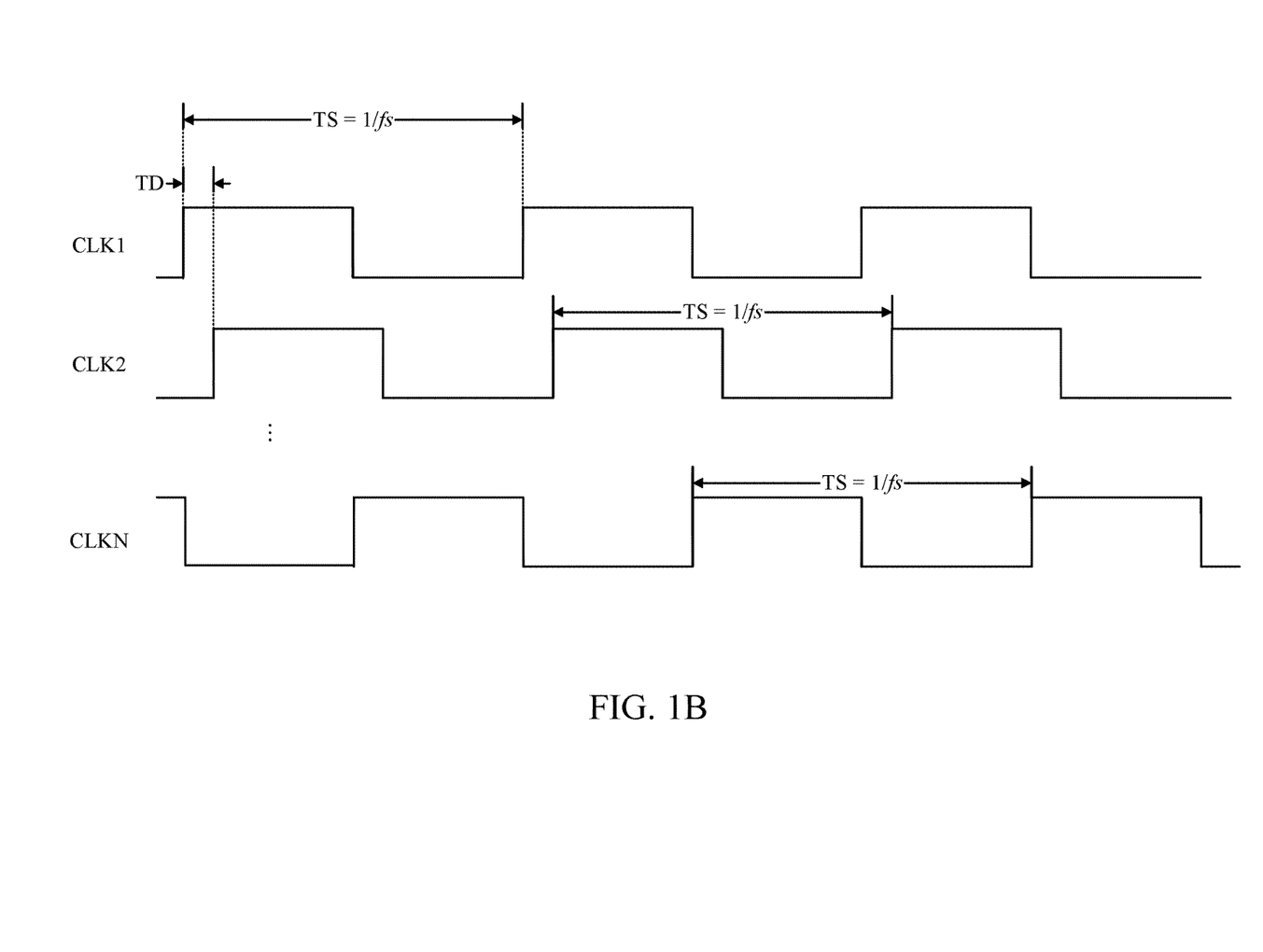
FIG. 1B is a schematic diagram illustrating waveforms of clock signals in FIG. 1A, according to some embodiments of the present disclosure.

Reference is now made to FIG. 1A and FIG. 1B. FIG. 1A is a schematic diagram of an analog-to-digital converter (ADC) device 100, according to some embodiments of the present disclosure. FIG. 1B is a schematic diagram illustrating waveforms of clock signals CLK1-CLKN in FIG.

1A, according to some embodiments of the present disclosure. In some embodiments, the ADC device 100 operates as a time-interleaved ADC having multiple channels.

In some embodiments, the ADC device 100 includes ADC circuitries AD1-ADN and a data output circuitry 130. Each ADC circuitry AD1-ADN operates as a single channel. In other words, in this example, the ADC device 100 includes N channels, and N is a positive integer larger than 1. The data output circuitry 130 is configured to, according to quantization outputs Q1-QN generated by the channels, perform a data combination operation and a down-sampling operation, or perform the down-sampling operation only, in order to generate a digital signal D0. In some embodiments, as described in FIG. 3 below, the data output circuitry 130 may generate the digital signal D0 without performing the data combination operation.

As shown in FIG. 1A, the ADC circuitries AD1-ADN are configured to perform an analog-to-digital conversion on an input signal VIN according to a corresponding one of the clock signals CLK1-CLKN, in order to generate a corresponding one of the quantization outputs Q1-QN. As shown in FIG. 1B, a period of each clock signals CLK1-CLKN is set as TS that equals to 1/fs. In other words, a sampling frequency of the ADC circuitries AD1-ADN is fs.

Taking the first channel as an example, the ADC circuitry AD1 includes a sampling circuit 110 and an ADC circuit 120. The sampling circuit 110 samples the input signal VIN according to the corresponding clock signal CLK1, in order to generate a sampling signal S1. The ADC circuit 120 is coupled to the sampling circuit 110 to receive the sampling signal S1. The ADC circuit 120 performs the analog-to-digital conversion according to the corresponding clock signal CLK1 to generate the quantization output Q1. The output of the ADC circuit 120 is coupled to the data output circuitry 130, in order to transmit the quantization output Q1 to the data output circuitry 130. Operations of the remaining channels are the same as the first channel, and thus the repetitious descriptions are not further given herein.

In some embodiments, a predetermine delay TD is present between two successive clock signals of the clock signals CLK1-CLKN. For example, as shown in FIG. 1B, the predetermined delay TD is present between the clock signals CLK1 and CLK2. As a result, the first channel and the second channel are able to perform the sampling operation and the analog-to-digital conversion at different timings. With this analogy, the N channels are able to operate according to interleaved timings.

Figure 2:
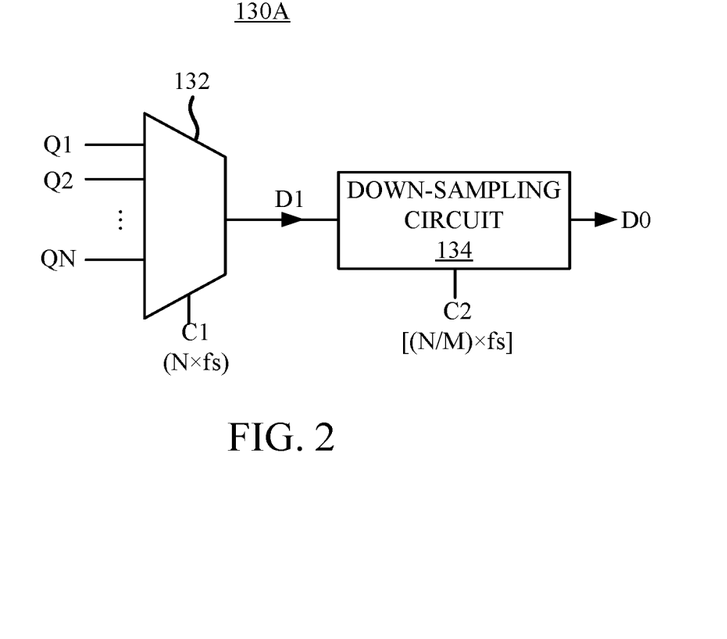
FIG. 2 is a circuit diagram of the data output circuitry in FIG. 1A, according to some embodiments of the present disclosure.

The data output circuitry 130 is coupled to the ADC circuits 120, in order to receive the quantization outputs Q1-QN. As described above, the data output circuitry 130 perform the data combination operation and the down-sampling operation on the quantization outputs Q1-QN generated from the channels, in order to generate the digital signal D0. In some embodiments, the data output circuitry 130 performs the data combination operation (as shown in FIG. 2 below) on the quantization outputs Q1-QN according to a control signal C1, in which a frequency of the control signal C1 is N times of the sampling frequency fs. With the data combination operation, the quantization outputs Q1-QN provided by the N channels are able to be combined into a single digital signal (i.e., a digital signal D1 in FIG. 2 below) having N times of the sampling frequency fs. In some embodiments, the single digital signal generated from the data combination operation is effective digital data expected to be outputted from the ADC device 100.

For example, the number of channels N is 20, a resolution of each channel is 10-bit, and the sampling frequency fs is set to 500 MHz. Under this condition, with the data combination operation, the ADC device 100 outputs the 10-bit digital signal which has a frequency of 10 GHz (i.e., 20×500M).

Figure 3:
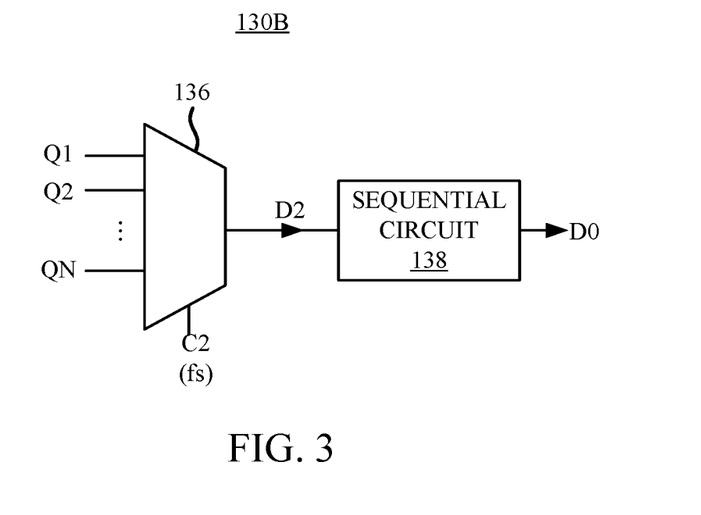
FIG. 3 is a circuit diagram of the data output circuitry in FIG. 1A, according to some embodiments of the present disclosure.

Furthermore, in some embodiments, the data output circuitry 130 performs the down-sampling operation on the quantization outputs Q1-QN according to a control signal C2, in order to generate the data signal D0. A frequency of the control signal C2 may be N/M times of the sampling frequency fs (as shown in FIG. 2 below) or may be the same as the sampling frequency fs (as shown in FIG. 3 below). As a result, a frequency (or a data rate) of the digital signal D0 is able to be reduced to the equivalent N/M times of the sampling frequency fs. In some embodiments, by measuring the digital signal D0, the overall performance of the ADC circuitries AD1-ADN (i.e. the ADC device 100) can be determined.

In some embodiments (as shown in FIG. 2 below), M may be set as N−1 or N+1. For example, if the number of channels N is 20, M may be 19 or 21. Under this condition, with the down-sampling operation, the ADC device 100 is able to output the 10-bit digital signal D0 which has a frequency of (20/19)×500 MHz or (20/21)×500 MHz. The configurations of M are given for illustrative purposes, and the present disclosure is not limited thereto. Various prime numbers to set the M (e.g., M may be 2N+1 or 2N−1) are within the contemplated scope of the present disclosure. By setting M as the prime number, it is able to prevent the data output circuitry 130 from constantly outputting the same quantization output, in order to assure that the digital signal D0 is sufficient to indicate the performance of the ADC device 100.

In some related approaches, in order to measure the performance of a time-interleaved ADC, multiple pins, which are connected to an instrument for measurement, are required to be arranged corresponding to the output of an ADC in each channel, or an additional memory is employed to store the effective digital data and provide the same to an external instrument for measurement. In these approaches, too many pins are required (for example, if the ADC of a channel outputs a 10-bit signal, 10 pins are required; if there are 10 channels, 100 pins are required), or the additional memory with high data storage capacity is required for measurement. As a result, the unnecessary hardware cost will be significantly increased. Moreover, if the effective digital data is measured, the instrument is required to support high speed digital data (e.g., N times of the sampling frequency fs). Based on the above reasons, the current approaches are not able to measure the time-interleaved ADC easily.

In the present disclosure, the digital signal D0, generated from the down-sampling operation, has a lower frequency (i.e., the equivalent N/M sampling frequency fs). As a result, the digital signal D0 is able to be measured to monitor the performance of the ADC device 100. Compared with the above approaches, the number of pins can be reduced (for example, if the digital signal D0 is a 10-bit signal, 10 pins are arranged) and the measurement can be performed without employing an additional memory. As a result, the related hardware cost is saved, and the specification requirement on the instrument can be lower. In an non-limiting experimental example (the number of channels N is 16, and the resolution of ADC circuitry is 10 bits), the measurement results, which are generated by analyzing the digital signals D1 and D0 with the above arrangements and fast Fourier transform, are similar to each other.

Reference is now made to FIG. 2. FIG. 2 is a circuit diagram of the data output circuitry in FIG. 1A, according to some embodiments of the present disclosure. For ease of understanding, like elements in FIG. 2 are designated with the same reference numbers with respect to FIG. 1A.

In some embodiments, as shown in FIG. 2, a data output circuitry 130A includes a multiplexer 132 and a down-sampling circuit 134. The multiplexer 132 is coupled to the outputs of the ADC circuits 120 in FIG. 1A, in order to receive the quantization outputs Q1-QN. The multiplexer 132 is configured to perform the data combination operation according to the control signal C1, in order to generate a digital signal D1. For example, the multiplexer 132 selects an output from the quantization outputs Q1-QN according to the control signal C1, and outputs the selected output as the digital signal D1, in which the data rate of the digital signal D1 is N times of the sampling frequency fs.

With continued reference to FIG. 2, the down-sampling circuit 134 is coupled to the output of the multiplexer 132, in order to receive the digital signal D1. The down-sampling circuit 134 is configured to perform the down-sampling operation on the digital signal D1 according to the control signal C2, in order to generate the digital signal D0, in which the frequency of the control signal C2 is N/M times of the sampling frequency fs. With this arrangement, the data rate of the digital signal D0 is the equivalent N/M times of the sampling frequency fs. In this example, M may be any prime number that is greater than or less than the number of channels N.

In this example, M may be set as a prime number that is different from N, but is not limited to the above-mentioned N−1 or N+1. If M was set as an even number and N was divisible by this even number, the down-sampling circuit 134 would down-sample the digital signal D1 at constant timings. For example, if N was 16 and M is set as 4, the down-sampling circuit 134 may down-sample the digital signal D1 at 4th, 8th, 12th, and 16th sampling points. As a result, the data output circuitry 130A may be unable to reflect the overall operating performance of the ADC device 100 effectively. Therefore, by setting the M as a prime number different from N, the above situation can be prevented, in order to assure that the digital signal D0 generated by the data output circuitry 130 is sufficient to indicate the overall performance of the ADC device 100.

Reference is now made to FIG. 3. FIG. 3 is a circuit diagram of the data output circuitry in FIG. 1A, according to some embodiments of the present disclosure. For ease of understanding, like elements in FIG. 3 are designated with the same reference numbers with respect to FIGS. 1A and 2.

Compared with FIG. 2, in this example, the data output circuitry 130 may generate the digital signal D0 without performing the data combination operation (i.e., the multiplexer 132 is not included). As shown in FIG. 3, a data output circuitry 130B includes a multiplexer 136 and a sequential circuit 138. The multiplexer 136 is coupled to the outputs of the ADC circuits 120 in FIG. 1A, in order to receive the quantization outputs Q1-QN. The multiplexer 136 is configured to perform the down-sampling operation according to the control signal C2, in order to generate a digital signal D2. For example, the multiplexer 136 sequentially selects one output from the quantization outputs Q1-QN, and outputs the selected output as the digital signal D2, in which a frequency of the control signal C2 is the same as the sampling frequency fs.

With continued reference to FIG. 3, the sequential circuit 138 is coupled to the output of the multiplexer 136, in order to receive the digital signal D2. The sequential circuit 138 is configured to synchronize multiple digital signals D2 and to add at least one redundant data to the same, in order to equivalently perform the above down-sampling operation. For example, in this example, M is set to be greater than the number of channels N (e.g., N+1) to add one redundant data during the combination of the multiple data signals D2, in order to generate the digital signal D0. For example, when N is 16 and M is 17, the sequential circuit 138 adds one redundant data (e.g., a bit of "0") after receiving 15 digital signals D2, and then combines the 15 digital signals with the redundant data as the digital signal D0. In some embodiments, the sequential circuit 138 is able to be delayed to output the digital signal D2 according to the operating schedule of the ADC circuits 120 of the N channels.

In some embodiments of FIG. 3, M is set to be the same as N or different from N. In some embodiments, the at least one redundant data may be a predefined data value. Accordingly, in subsequent measurement, the predefined data value can be identified and removed from the digital signal D0, in order to assure that the performance of the ADC device 100 can be correctly determined.

In some embodiments, the sequential circuit 138 may be implemented with a data buffer. In some embodiments, the sequential circuit 138 may be implemented with a first-in, first-out (FIFO) circuit. The above implementations of the sequential circuit 138 are given for illustrative purposes, and various circuit able to perform the data synchronization are within the contemplated scope of the present disclosure.

Figure 4:
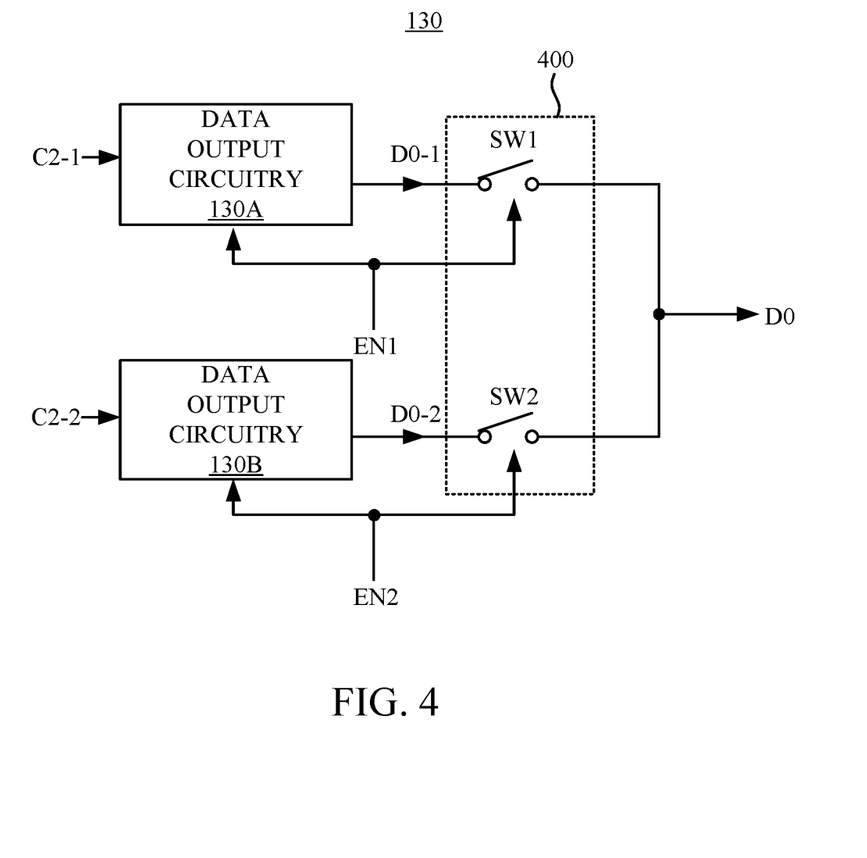
FIG. 4 is a schematic diagram of an arrangement between the data output circuitries and a control circuit, according to some embodiments of the present disclosure.

Reference is now made to FIG. 4. FIG. 4 is a schematic diagram of an arrangement between the data output circuitries 130A and 130B and a control circuit 400, according to some embodiments of the present disclosure. For ease of understanding, like elements in FIG. 4 are designated with the same reference numbers with respect to FIGS. 1-3.

In various embodiments, the ADC circuitry may employ a single data output circuitry 130 (e.g., the data output circuitry 130A in FIG. 2, or the data output circuitry 130B in FIG. 3) or employ both of the two data output circuitries 130A and 130B. For example, as shown in FIG. 4, the ADC device 100 may include two data output circuitries 130A and 130B and the control circuit 400. In this example, the data output circuitries 130A and 130B operate as two data output sub-circuits of the data output circuitry 130 in FIG. 1A.

The control circuit 400 includes two switches SW1 and SW2. The switch SW1 is coupled to the output of the data output circuitry 130A. The switch SW2 is coupled to the output of the data output circuitry 130B. When the switch SW1 is turned on, a digital signal D0-1 (i.e., the digital signal D0 in FIG. 2) generated from the data output circuitry 130A is outputted as the digital signal D0 via the switch SW1. Alternatively, when the switch SW2 is turned on, a digital signal D0-2 (i.e., the digital signal D0 in FIG. 3) generated from the data output circuitry 130B is outputted as the digital signal D0 via the switch SW2.

It is noted that, a frequency of the control signal C2 for controlling the data output circuitry 130A (i.e., a control signal C2-1 in FIG. 4) is N times of the sampling frequency fs, a frequency of the control signal C2 for controlling the data output circuitry 130B (i.e., a control signal C2-2 in FIG. 4) is the same as the sampling frequency fs.

In this example, the switch SW1 and the data output circuitry 130A are all configured to be controlled according to an enable signal EN1, and the switch SW2 and the data output circuitry 130B are all configured to be controlled according to an enable signal EN2. In other words, the switch SW1 may be turned on according to the enable signal EN1, and the data output circuitry 130A is activated according to the enable signal EN1, in order to perform the operations discussed in FIG. 2. Alternatively, the switch SW2 may be turned on according to the enable signal EN2, and the data output circuitry 130B is activated according to the enable signal EN2, in order to perform the operations discussed in FIG. 3.

The arrangements of the control circuit 400 are given for illustrative purposes, and various arrangements to implement the same functions of the control circuit 400 are within the contemplated scope of the present disclosure.

Figure 5:
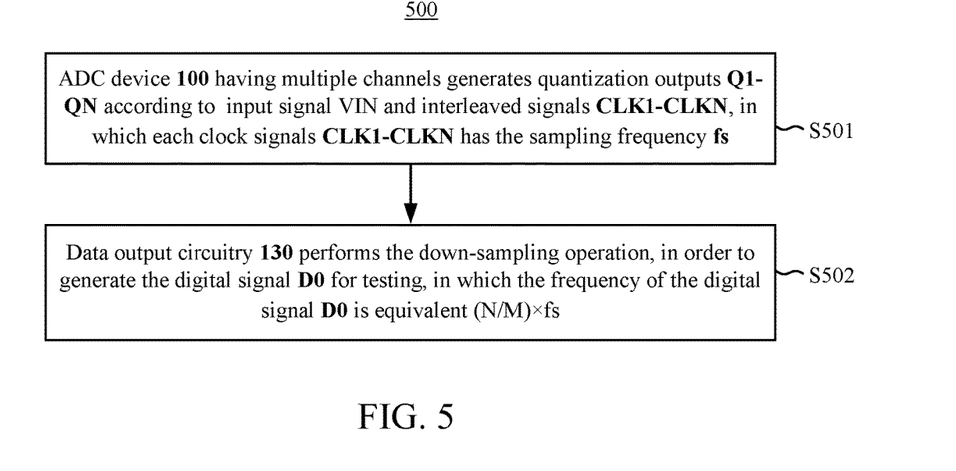
FIG. 5 is a flowchart of a method for generating a testing signal, according to some embodiments of the present disclosure.

FIG. 5 is a flowchart of a method 500 for generating a testing signal, according to some embodiments of the present disclosure. For ease of understanding, the method 500 will be described with reference to the above figures.

In operation S501, the ADC device 100 having multiple channels generates the quantization outputs Q1-QN according to the input signal VIN and interleaved signals CLK1-CLKN, in which each clock signals CLK1-CLKN has the sampling frequency fs.

For example, as shown in FIG. 1A and FIG. 1B, the ADC device 100 includes the N channels of ADC circuitries AD1-ADN, in order to operate as a time-interleaved ADC. The N channels of ADC circuitries AD1-ADN may convert the input signal VIN according to the interleaved clock signals CLK1-CLKN, in order to generate the quantization outputs Q1-QN.

In operation S502, the data output circuitry 130 performs the down-sampling operation, in order to generate the digital signal D0 for testing, in which the frequency of the digital signal D0 is equivalent (N/M)×fs.

For example, as shown in FIG. 2, the data output circuitry 130A may perform the data combination operation according to the control signal C1 and the quantization outputs Q1-QN to generate the digital signal D1, then perform the down-sampling operation according to the control signal C2 and the digital signal D1 to generate the digital signal D0. Alternatively, as shown in FIG. 3, the data output circuitry 130B may directly perform the down-sampling operation according to the control signal C1 and the quantization outputs Q1-QN, in order to generate the digital signal D0.

With operation S502, the digital signal D0, which has a lower frequency, for testing can be generated. As a result, the hardware cost and the difficulty for measuring the ADC device 100 can be effectively reduced.

The above description of the method 500 includes exemplary operations, but the operations of the method 500 are not necessarily performed in the order described above. The order of the operations of the method 500 can be changed, or the operations can be executed simultaneously or partially simultaneously as appropriate, in accordance with the spirit and scope of various embodiments of the present disclosure.

As described above, the ADC device and the method for generating the testing signal may perform the down-sampling operation on outputs of ADCs in multiple channels, in order to generate a testing signal having lower frequency. As a result, the hardware cost and the difficulty for measuring the overall performance of the ADC device can be reduced.

Various functional components or blocks have been described herein. As will be appreciated by persons skilled in the art, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An analog-to-digital converter device, comprising:
a plurality of analog-to-digital converter circuitries, corresponding to a plurality of channels respectively, the plurality of analog-to-digital converter circuitries configured to convert an input signal to generate a plurality of quantization outputs according to a plurality of interleaved clock signals, wherein each of the plurality of interleaved clock signals has a sampling frequency; and
a data output circuitry coupled to the plurality of analog-to-digital converter circuitries, the data output circuitry configured to perform a down-sampling operation according to a first control signal and the plurality of quantization outputs, in order to generate a first digital signal,
wherein the first digital signal is for determining a performance of the plurality of analog-to-digital converter circuitries, and a frequency of the first digital signal is (N/M) times of the sampling frequency, and N is a positive integer and is a number of the plurality of channels.

2. The analog-to-digital converter device of claim 1, wherein a frequency of the first control signal is N/M times of the sampling frequency.

3. The analog-to-digital converter device of claim 1, wherein the data output circuitry comprises:
a multiplexer coupled to the plurality of analog-to-digital converter circuitries, the multiplexer configured to select an output from the plurality of quantization outputs according to a second control signal, and to output the selected output as a second digital signal; and
a down-sampling circuit coupled to the multiplexer, the down-sampling circuit configured to perform the down-sampling operation according to the first control signal and the second digital signal, in order to generate the first digital signal, wherein M is a prime number different from N.

4. The analog-to-digital converter device of claim 3, wherein a frequency of the second control signal is N times of the sampling frequency.

5. The analog-to-digital converter device of claim 1, wherein the data output circuitry comprises:
a multiplexer coupled to the plurality of analog-to-digital converter circuitries, the multiplexer configured to select an output from the plurality of quantization outputs according to the first control signal, and to output the selected output as a second digital signal; and
a sequential circuit coupled to the multiplexer, the sequential circuit configured to combine the second digital signal and at least one redundant data, in order to generate the first digital signal.

6. The analog-to-digital converter device of claim 1, wherein a frequency of the first control signal is the same as the sampling frequency.

7. The analog-to-digital converter device of claim 1, wherein the data output circuitry comprises:
a first data output sub-circuit coupled to the plurality of analog-to-digital converter circuitries, the first data output sub-circuit configured to perform a data combination operation according to a second control signal and the plurality of quantization outputs to generate a second digital signal, and to perform the down-sampling operation according to the first control signal and the second digital signal, in order to generate a third digital signal;
a second data output sub-circuit coupled to the plurality of analog-to-digital converter circuitries, the second data output sub-circuit configured to select an output from the plurality of quantization outputs according to a third control signal, and to output the selected output as a fourth digital signal, and to perform the down-sampling operation according to the fourth digital signal, in order to generate a fifth digital signal; and
a control circuit coupled to the first data output sub-circuit and the second data output sub-circuit, the control circuit configured to selectively output one of the third digital signal and the fifth digital signal as the first digital signal.

8. The analog-to-digital converter device of claim 7, wherein the control circuit comprises:
a first switch coupled to the first data output sub-circuit to receive the third digital signal, wherein if the first switch is turned on, the first data output sub-circuit outputs the third digital signal, via the first switch, as the first digital signal; and
a second switch coupled to the second data output sub-circuit to receive the fifth digital signal, wherein if the second switch is turned on, the second data output sub-circuit outputs the fifth digital signal, via the second switch, as the first digital signal.

9. A method for generating testing signal, the method comprising:
converting, by a plurality of analog-to-digital converter circuitries that correspond to a plurality of channels respectively, an input signal according to a plurality of interleaved clock signals to generate a plurality of quantization outputs, wherein each of the plurality of interleaved clock signals has a sampling frequency; and
performing a down-sampling operation according to a first control signal and the plurality of quantization outputs, in order to output a first digital signal,
wherein the first digital signal is for determining a performance of the plurality of analog-to-digital converter circuitries, a frequency of the first digital signal is N/M times of the sampling frequency, and N is a positive integer and is a number of the plurality of channels.

10. The method of claim 9, wherein a frequency of the first control signal is N/M times of the sampling frequency.

11. The method of claim 9, wherein performing the down-sampling operation comprises:
selecting, by a multiplexer, an output from the plurality of quantization outputs according to a second control signal, in order to output the selected output as a second digital signal; and
performing, by a down-sampling circuit, the down-sampling operation according to the first control signal and the second digital signal, in order to generate the first digital signal, wherein M is a prime number different from N.

12. The method of claim 11, wherein a frequency of the second control signal is N times of the sampling frequency.

13. The method of claim 9, wherein performing the down-sampling operation comprises:
selecting, by a multiplexer, an output from the plurality of quantization outputs according to the first control signal, in order output the selected output as a second digital signal; and
combining, by a sequential circuit, the second digital signal and at least one redundant data, in order to generate the first digital signal.

14. The method of claim 13, wherein a frequency of the first control signal is the same as the sampling frequency.

15. The method of claim 9, wherein performing the down-sampling operation comprises:
performing, by a first data output sub-circuit, a data combination operation according to a second control signal and the plurality of quantization outputs to generate a second digital signal, and performing the down-sampling operation according to the first control signal and the second digital signal, in order to generate a third digital signal;
selecting, by a second data output sub-circuit, an output from the plurality of quantization outputs according to a third control signal, to output the selected output as a fourth digital signal, and performing the down-sampling operation according to the fourth digital signal, in order to generate a fifth digital signal; and
selectively outputting one of the third digital signal and the fifth digital signal as the first digital signal.

16. The method of claim 15, wherein selectively outputting the one of the third digital signal and the fifth digital signal as the first digital signal comprises:
turning on a first switch, wherein if the first switch is turned on, the first data output sub-circuit outputs the third digital signal, via the first switch, as the first digital signal; and
turning on a second switch, wherein if the second switch is turned on, the second data output sub-circuit outputs the fifth digital signal, via the second switch, as the first digital signal.

* * * * *